(12) United States Patent
Grace

(10) Patent No.: US 7,576,676 B2
(45) Date of Patent: Aug. 18, 2009

(54) ANALOG-TO-DIGITAL CONVERTER USING LOOKAHEAD PIPELINED ARCHITECTURE AND OPEN-LOOP RESIDUE AMPLIFIERS

(75) Inventor: Carl Grace, Cary, NC (US)

(73) Assignee: ClariPhy Communications, Inc., Irvine, CA (US)

( * ) Notice: Subject to any disclaimer, the term of this patent is extended or adjusted under 35 U.S.C. 154(b) by 0 days.

(21) Appl. No.: 11/551,701

(22) Filed: Oct. 20, 2006

(65) Prior Publication Data

US 2007/0176814 A1 Aug. 2, 2007

Related U.S. Application Data

(60) Provisional application No. 60/764,866, filed on Feb. 2, 2006.

(51) Int. Cl.
H03M 1/38 (2006.01)
(52) U.S. Cl. ............... 341/161; 341/118; 341/155; 341/120
(58) Field of Classification Search .......... 341/118, 341/119, 120, 156, 161, 155
See application file for complete search history.

(56) References Cited

U.S. PATENT DOCUMENTS

| | | | |
|---|---|---|---|
| 5,239,299 A | 8/1993 | Apple et al. | |
| 5,696,511 A * | 12/1997 | Matsumoto et al. | 341/161 |
| 6,369,744 B1 * | 4/2002 | Chuang | 341/161 |
| 6,377,195 B1 * | 4/2002 | Eklund et al. | 341/118 |
| 6,384,757 B1 * | 5/2002 | Kosonen | 341/120 |
| 6,473,013 B1 * | 10/2002 | Velazquez et al. | 341/120 |
| 6,489,904 B1 * | 12/2002 | Hisano | 341/120 |
| 6,606,042 B2 * | 8/2003 | Sonkusale et al. | 341/120 |
| 6,642,871 B2 * | 11/2003 | Takeyabu et al. | 341/120 |
| 6,861,969 B1 * | 3/2005 | Ali | 341/161 |
| 6,904,110 B2 | 6/2005 | Trans et al. | |
| 6,909,391 B2 * | 6/2005 | Rossi | 341/161 |
| 2002/0012152 A1 * | 1/2002 | Agazzi et al. | 359/189 |
| 2002/0113726 A1 * | 8/2002 | Nagaraj | 341/156 |
| 2003/0184466 A1 * | 10/2003 | Takeyabu et al. | 341/156 |
| 2004/0086275 A1 | 5/2004 | Lenosky et al. | |
| 2004/0160351 A1 * | 8/2004 | Rossi | 341/161 |
| 2005/0068221 A1 * | 3/2005 | Freeman et al. | 341/161 |
| 2005/0152479 A1 | 7/2005 | Bulow et al. | |
| 2005/0219091 A1 | 10/2005 | Wood et al. | |
| 2006/0066466 A1 * | 3/2006 | Pan et al. | 341/161 |
| 2006/0279445 A1 * | 12/2006 | Kinyua et al. | 341/155 |

OTHER PUBLICATIONS

PCT International Search Report and Written Opinion, PCT/US06/44679, Mar. 21, 2008, 11 pages.
PCT International Search Report and Written Opinion, PCT/US06/38690, Nov. 5, 2007, 10 pages.
Chang, Dong-Young, et al., Sub 1-V Design Techniques for High-Linearity Multistage/Pipelined Analog-to-Digital Converters, IEEE Transactions on Circuits and Systems—1: Regular Papers, vol. 52, No. 1, Jan. 2005, pp. 1-12.

* cited by examiner

Primary Examiner—Jean B Jeanglaude
(74) Attorney, Agent, or Firm—Fenwick & West LLP

(57) ABSTRACT

A lookahead pipelined ADC architecture uses open-loop residue amplifiers with calibration. This approach is able to achieve a high-speed, high-accuracy ADC with reduced power consumption. In one aspect, an ADC pipeline unit includes a plurality of lookahead pipeline stages (i.e., an ADC lookahead pipeline) coupled to a calibration unit. The ADC lookahead pipeline uses open-loop residue amplifiers. The calibration unit compensates for non-linearity in the open-loop amplifiers.

35 Claims, 5 Drawing Sheets

ANALOG-TO-DIGITAL CONVERTER USING LOOKAHEAD PIPELINED ARCHITECTURE AND OPEN-LOOP RESIDUE AMPLIFIERS

CROSS-REFERENCE TO RELATED APPLICATION

This application claims priority under 35 U.S.C. § 119(e) to U.S. Provisional Patent Application Ser. No. 60/764,866, "ADC Provisional Patent Application," by Carl Grace, filed Feb. 2, 2006. The subject matter of the foregoing is incorporated herein by reference in its entirety.

BACKGROUND OF THE INVENTION

1. Field of the Invention

This invention relates generally to analog-to-digital converters. More particularly, it relates to high speed analog-to-digital converters using lookahead pipelined architecture and open-loop residue amplifiers.

2. Description of the Related Art

There is a need for high speed analog-to-digital converters (ADCs). For example, there is strong commercial interest in 10 Gbit/s serial data transmission. In order to enable high performance sampling detectors, such as the Viterbi detector, a higher receive SNR is required than is required for suboptimal detectors such as decision feedback equalization. In order to provide these higher SNRs, 10 Gigasamples per second (GS/s) ADCs with 5-8 bits of accuracy are currently required.

However, power dissipation is a significant problem for higher speed ADCs. In fact, all previously reported multi-GHz ADCs use too much power to be considered viable for 10 Gbit/s serial data transmission applications. A useful figure of merit in evaluating the power efficiency of an ADC is the quantization energy $E_Q$, expressed in picojoules per conversion step:

$$E_Q = \frac{Power}{2^{ENOB}(2F_{BW})} \quad (1)$$

where Power is the power consumption in watts, ENOB is the effective number of bits of the ADC, and $F_{BW}$ is the full-speed bandwidth of the converter (equal to Fs/2 in a full Nyquist ADC). The presently reported state of the art for very high speed ADCs is 1.6 GS/s conversion rate but with quantization energy of 7.4 pJ/conv-step. A more power efficient ADC is reported at only 1.0 pJ/conv-step but it only has a conversion rate of 80 MS/s.

A goal of current ADCs is a conversion rate of 10 GS/s with a resolution of 5 bits per sample and a quantization energy of 0.3 pJ/conv-step. This goal is important in order to reduce overall system power to a point where 10 Gbit/s data transmission using the Viterbi detector would be commercially viable using current technology.

Two common architectures for high speed ADCs are flash and pipeline. The flash ADC is the simplest and inherently fastest ADC. It uses $2^N-1$ parallel comparators, where N is the number of bits. The incoming analog value is simultaneously applied to each of the comparators, with the aggregate results from all of the comparisons determining the digital representation. Besides complexity and power consumption that grows geometrically with resolution, high-resolution flash converters have tight offset requirements that further increase power consumption.

The pipelined ADC uses simpler, lower resolution ADC stages which work concurrently on different samples of the input, so the throughput is equal to the speed of a given stage and is almost independent of the number of stages. The power consumption of a pipeline grows linearly with the number of bits, and offset requirements are reduced in the low resolution ADC stages when redundancy is applied. However, the ADC stages typically include linear residue amplifiers, which traditionally are implemented as operational amplifiers connected in a negative feedback configuration. The use of a closed feedback loop increases the power consumption.

Thus, there is a need for high speed ADCs that can achieve both high speed and high accuracy while simultaneously achieving low power consumption.

SUMMARY OF THE INVENTION

The present invention overcomes the limitations of the prior art by providing a lookahead pipelined ADC architecture that uses open-loop residue amplifiers with calibration. This approach is able to achieve a high-speed, high-accuracy ADC with reduced power consumption.

In one aspect, an ADC pipeline unit includes a plurality of lookahead pipeline stages (i.e., an ADC lookahead pipeline) coupled to a calibration unit. The ADC lookahead pipeline includes open-loop residue amplifiers, which results in faster and/or lower power operation. The lookahead architecture allows other circuitry to keep pace with the open-loop amplifiers. The calibration unit compensates for non-linearity in the open-loop amplifiers. Furthermore, assume that the ADC pipeline unit performs an N-bit digital conversion. The ADC pipeline generates M raw bits, with M>N, thus adding redundancy to compensate for the lower accuracy open-loop amplifiers.

One advantage of using open-loop residue amplifiers is that they can increase the sampling rate possible at a given power consumption by removing the requirement for linear amplifiers. In an ADC pipeline unit with open-loop residue amplifiers, the comparators in the sub-ADCs consume significant power relative to the residue amplifiers. This is in contrast to a conventional ADC pipeline in which the overall stage power consumption is typically dominated by the power consumption of the operational amplifier. To reduce comparator power and to reduce the risk of comparator metastability (which is important to achieve a low bit-error rate), the lookahead architecture is used in order to give the comparator more time to regenerate. To achieve higher accuracy than is possible based solely on component manufacturing tolerances, non-linear calibration is used to desensitize the ADC pipeline from errors in the gain and offset values of the open-loop residue amplifiers.

In one aspect, the ADC pipeline unit includes M lookahead pipeline stages for an N-bit ADC with M>N and each lookahead pipeline stage generates 1 raw bit. In other words, the ADC pipeline unit uses a sub-radix architecture.

In another aspect, the calibration unit includes a lookup table. For example, the lookup table can use the M raw bits generated by the ADC pipeline as an address to the lookup table. The contents at any M-bit address are the corresponding N-bit digital representation. Optionally, the calibration unit can update the lookup table, possibly automatically during operation.

In one specific sub-radix design, the lookahead pipeline stages include an input sample-and-hold stage, a first lookahead pipeline "half" stage and M−1 lookahead pipeline "full" stages. The sample-and-hold stage receives the input analog value. Each of the other stages, including the first half stage, produces one of the M raw bits. The half stage and full stages all use open-loop residue amplifiers. In one implementation, the first half stage includes a single comparator for determining the first raw bit. Each of the other full stages includes two comparators. One comparator determines the raw bit for the stage, assuming that the raw bit from the previous stage was 0. The other comparator determines the raw bit for the stage, assuming that the raw bit from the previous stage was 1. A selector (e.g., a switch) then selects the correct output based on the raw bit from the previous stage.

In another aspect of the invention, pipeline units as described above are multiplexed to produce an interleaved ADC. The interleaved ADC includes an analog demultiplexer, K ADC channels and a digital multiplexer. For example, an incoming 10 GS/s analog stream can be demultiplexed into eight 1.25 GS/s analog streams (K=8). Each ADC channel converts one of these analog streams into a corresponding digital streams, which are then multiplexed together to form the final digital output stream.

In one design, each ADC channel includes two ADC pipeline units. One unit is in operation while the other is in calibration. The two pipeline units automatically interchange roles of operation and calibration.

Other aspects of the invention include systems using the devices described above, and methods corresponding to and applications for these devices and systems.

BRIEF DESCRIPTION OF THE DRAWINGS

The invention has other advantages and features which will be more readily apparent from the following detailed description of the invention and the appended claims, when taken in conjunction with the accompanying drawings, in which:

DETAILED DESCRIPTION OF THE PREFERRED EMBODIMENTS

Figure 1:
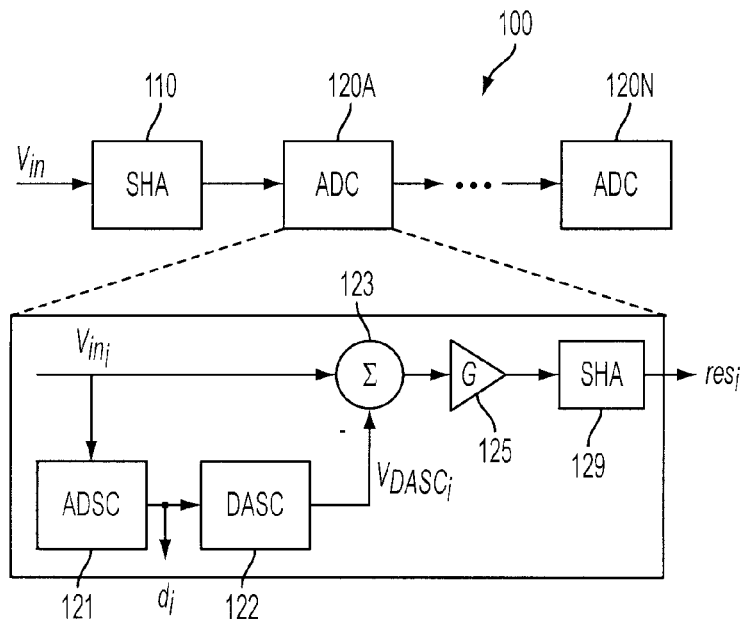
FIG. 1 is a block diagram illustrating a pipelined ADC architecture, suitable for use with the present invention.

FIG. 1 is a block diagram illustrating a pipelined ADC architecture suitable for use with the present invention. The ADC pipeline 100 includes an input sample-and-hold stage 110 followed by a number of low resolution ADC stages 120A-120N. The stages 120 preferably are identical, except that the beginning and ending stages may be different due to their location at the beginning or end of the pipeline 100. In this example, each ADC stage 120 is a 1-bit stage. Each stage 120 includes a 1-bit analog-to-digital converter (e.g., a comparator) 121, a 1-bit digital-to-analog converter 122 (e.g., a switch), an analog subtractor 123, a gain stage (i.e., the residue amplifier) 125, and a sample-and-hold circuit 129. The 1-bit ADC 122, which will also be referred to as a sub-ADC, makes a 1-bit decision on the input signal $V_{ini}$ for the stage 120. This bit $d_i$ is used in the sub-DAC 122 to generate a voltage $V_{DASCi}$ representing the contribution of that bit $d_i$ to the input signal $V_{ini}$. The subtractor 123 subtracts the contribution $V_{DASCi}$ from the input signal $V_{ini}$ to develop a residue, which is the remaining value of the input signal after the value of the previously decided bits is removed. The residue amplifier 125 multiplies the residue by a gain value G (which is 2 if the stage converts one effective bit). The resulting residue $res_i$ is held in a sample-and-hold circuit 129 and used as the input signal $V_{ini}$ for the next stage. Thus, each stage is operating to produce 1 bit of the result. The gain of 2 applied by the residue amplifier 125 scales the residue so that the same circuitry can be used for the next stage. The speed of this converter is limited by the critical path consisting of the 1-bit ADC (typically a comparator) 121, the 1-bit DAC (which is typically just a switch) 122, the subtractor 123, and the residue amplifier 125.

Unlike conventional ADC pipelines, the residue amplifiers 125 according to the invention are implemented as open-loop amplifiers. In a conventional ADC pipelines, the residue amplifiers 125 are closed-loop amplifiers. Closed-loop amplifiers can be more closely controlled, in terms of parameters such as gain and nonlinearity. However, closed-loop amplifiers have more severe speed limitations or require more power to achieve a given speed than open-loop amplifiers. The use of open-loop amplifiers provides higher speed (increases swing and bandwidth) with lower power. It can also reduce requirements on transistor performance.

However, because the gain G provided by open-loop amplifiers 125 can be less controlled, some form of redundancy is preferably employed to avoid the loss of analog information in the pipeline. In one approach, a sub-radix architecture with redundancy is used. In a non-redundant architecture, the total number of raw bits $d_i$ generated by the stages 120 is the same as the number of bits in the digital representation. In a redundant architecture, the stages 120 produce more raw bits $d_i$ than the number of output bits in the digital representation. The extra bits represent redundant information which is used to correct errors in the pipeline. In a sub-radix architecture, each stage 120 outputs one raw bit $d_i$ but effectively converts less than one output bit of the digital representation. Therefore, the total number of stages 120 is more than the number of output bits in the digital value.

For example, in one non-redundant architecture, each stage 120 effectively converts 1 bit and the residue amplifier gain G is 2. Therefore, eight stages 120 are required to implement an 8-bit A/D conversion. The eight raw bits $d_i$ are the actual output bits in the digital representation of the analog value, with the raw bit from stage 1 being the most significant output bit. As an example of a sub-radix architecture, each stage 120 might generate 1 raw bit but convert only 0.8 output bits with a residue amplifier gain G of $2^{0.8}$. More stages 120 are required, 10 stages in this case to implement an 8-bit A/D conversion. The 10 raw bits $d_i$ from the stages 120 are not the 8 output bits in the digital representation but are used to generate the final 8 bits using known algorithms. The sub-radix architecture allows gains errors to be tolerated by an amount proportional to the amount of gain reduction. It also allows redundancy with not much additional hardware.

A popular redundancy technique is a 1.5 output bits/stage architecture. In this technique, each stage 120 outputs 2 raw bits (thereby requiring additional comparators, which dissipate additional power), and backend processing uses this redundant information to improve accuracy. Using this technique, the accuracy of the ADC pipeline is set primarily by the accuracy of the interstage gain G. Because the gain of open-loop interstage amplifiers 125 is not as well controlled, this technique is not preferred for the present application. A sub-radix architecture, on the other hand, maintains 1 output bit per stage but provides redundancy by interstage gains of less than 2, and the accuracy of the interstage gain G is not as central to the architecture. This requires additional stages 120 (for example, an 8-bit ADC pipeline might require 10 or 11 stages using this technique) but only 1 comparator per stage. Again, backend processing uses the redundant information to provide the required accuracy.

Figure 2:
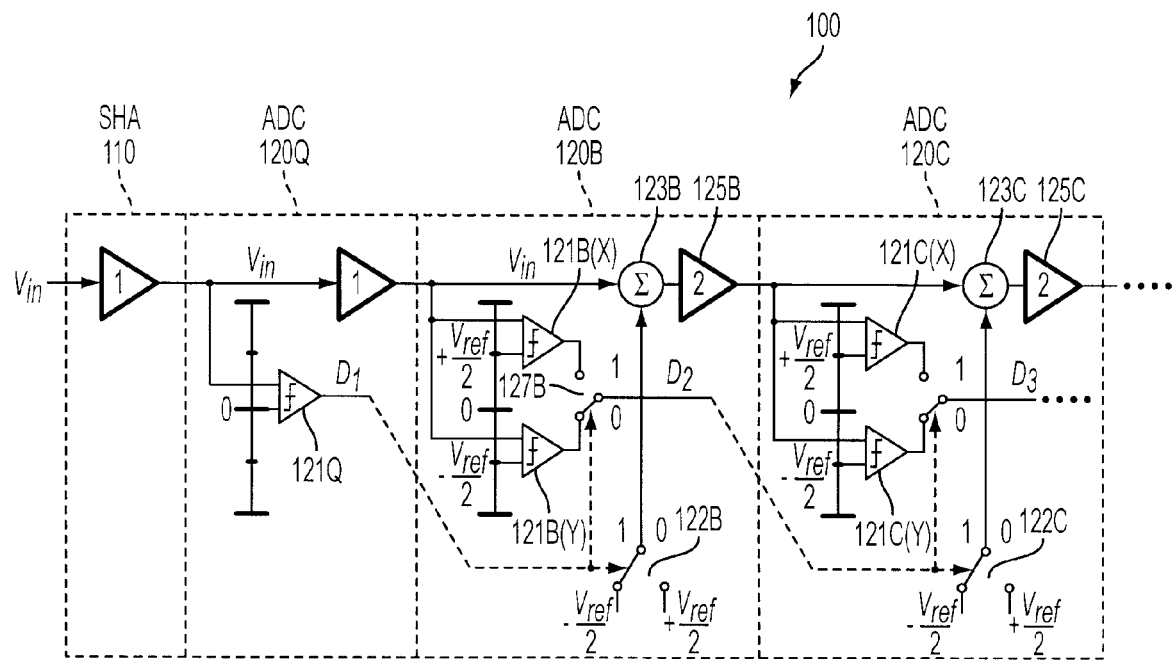
FIG. 2 is a block diagram of a lookahead ADC pipeline with open-loop residue amplifiers, according to the invention.

FIG. 2 is a block diagram of an ADC pipeline with lookahead capability. In a conventional ADC pipeline, the high speed comparator 121 regenerates between clock phases. This allows the comparator output time for positive feedback to drive the output to the desired value. Because of the relatively slower closed-loop interstage amplifiers, the clock period is set long enough that the comparator 121 has plenty of time to regenerate. However, with faster open-loop interstage amplifiers 125 and the resulting shorter clock periods, the comparator 121 may not have enough time to completely regenerate. One solution is to use a lookahead pipeline.

In the lookahead pipeline, the critical timing path, consisting of the amplifier settling time plus the comparator regeneration time, is broken into two shorter paths. In the example shown, all stages 120 (other than the first stage 120Q) have a pair of comparators 121(X) and 121(Y) (rather than a single comparator) that operates to develop the possible values for the stage based on the input value to the previous stage. This basically allows the interstage amplification and the comparator operation to occur in parallel, giving the comparators an entire clock half-period to regenerate. In this architecture, the first stage 120Q (that generates raw bit $D_1$) is a "half-stage" that uses a single comparator. The remaining stages 120B-N use two comparators 121 per stage. The last stage may be simplified since there is no following stage. The last stage could contain only the circuitry required to generate the last raw bit $D_N$ (e.g., eliminating the subtractor 123N and open-loop amplifier 125N). The architecture is somewhat more complex that an ADC pipeline without lookahead, but it allows much higher speeds when the interstage amplifier's speed is comparable to the comparator's speed.

In some sense, the sub-ADC 121 operation for a lookahead stage is moved ahead one stage. Referring to FIG. 2, stage 120B determines bit $D_2$. However, the input value to stage 120B is the original $V_{in}$. It is not the residue of $V_{in}$ after the contribution due to bit $D_1$ has been removed, as would be the case in an ADC pipeline without lookahead. In fact, the output of stage 120B (rather than the input) is the residue after the $D_1$ contribution has been removed. This one-stage shift is what allows the interstage amplification and the comparator operation to occur in parallel.

However, the sub-ADC 121 for stages 120B-N becomes more complex. The sub-ADC 121B for the second lookahead stage 120B includes two comparators 121B(X) and 121B(Y). These comparators determine the bit $D_2$ for stage 120B. Comparator 121B(X) determines bit $D_2$ assuming that bit $D_1$ is a 1. Comparator 121B(Y) determines bit $D_2$ assuming that bit $D_1$ is a 0. Switch 127B determines which result to select, depending on the output of sub-ADC 121Q of the previous stage 120Q. The bit $D_2$ is fed to the sub-DAC 122C of stage 120C.

As described above, the lookahead pipeline architecture allows a full clock half period for the comparators to regenerate. There is also the potential to use part of the amplifier settling time for comparator regeneration, since the amplifier output will be approaching its final value closely enough that the comparator threshold has been passed and the comparator can begin regenerating.

Figure 3:
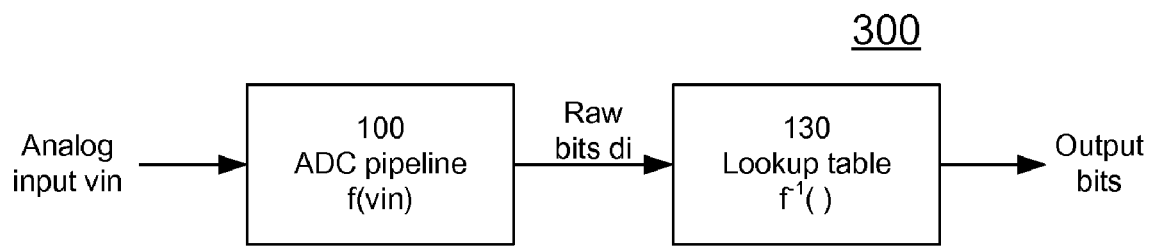
FIG. 3 is a block diagram of a lookup table approach to compensate for amplifier non-linearity.

FIG. 3 is a block diagram of a lookup table approach to compensating for amplifier non-linearity. A pipelined ADC typically requires fairly linear residue amplifiers 125 if the result is to be used without additional correction. One drawback of using open-loop amplifiers 125 is they can be non-linear. Different approaches can be used to compensate for effects caused by the non-linearity of open-loop amplifiers 125. FIG. 3 illustrates one approach using a lookup table. The overall ADC pipeline unit 300 includes an ADC pipeline 100 followed by a calibration unit, which in this example is a lookup table 130. As a result of the non-linearities of the individual stages 120 in the pipeline 100, the response of the overall ADC pipeline 100 has a complex non-linear characteristic, denoted in FIG. 3 by a function f(vin). In other words, the raw bits $d_i$ generated by the pipeline stages do not map in a linear manner to the output bits in the final digital representation. In FIG. 3, the "distorted" raw bits $d_i$ from the ADC pipeline 100 are applied to a lookup table 130 which stores the inverse of the non-linear characteristic. Thus, the LUT 130 reverses the effects of the non-linear open-loop amplifiers, and the output of the LUT 130 is used as the digital output of the ADC.

Figure 4:
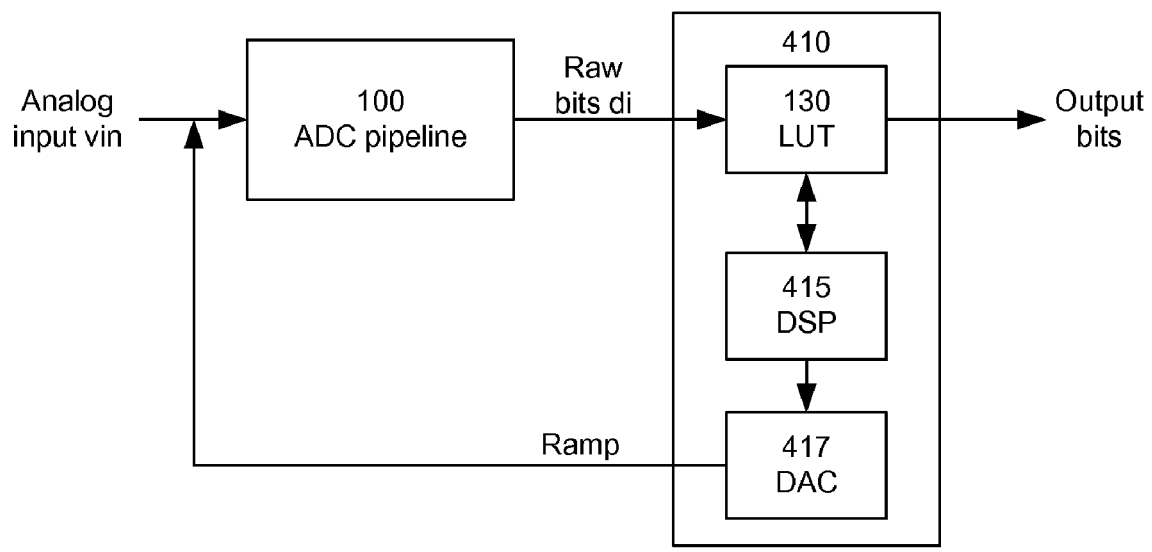
FIG. 4 is a block diagram illustrating calibration of the lookup table in FIG. 3.

FIG. 4 is a block diagram illustrating calibration of LUT 130. The non-linear mapping stored in LUT 130 is generated by a calibration operation. In FIG. 4, other parts of the calibration unit 410 map the nonlinear response of the ADC pipeline 100 by applying known voltages to the input of the pipeline 100 and observing the resulting raw bits $d_i$. In the example illustrated, when a given ADC pipeline 100 is in calibration mode, the calibration unit 410 generates a slow but accurate ramp. Since the ramp can be relatively slow, a digital ramp (e.g., from the system DSP 415) can be applied to a digital to analog converter (DAC) 417 that has the required accuracy. The known ramp values are applied to the ADC pipeline 100, and the resulting raw bits $d_i$ are used as an address in the lookup table 130 that contains the known ramp value (i.e., the actual output bits corresponding to vin). In this way, all possible values of vin are represented in the table 130 by the raw bits $d_i$ corresponding to that value of vin.

Now consider the design of an ADC for the following specific application:

10 GS/s nominal conversion rate (10.3125 GS/s actual conversion rate)

8 bit accuracy

Figure 5:
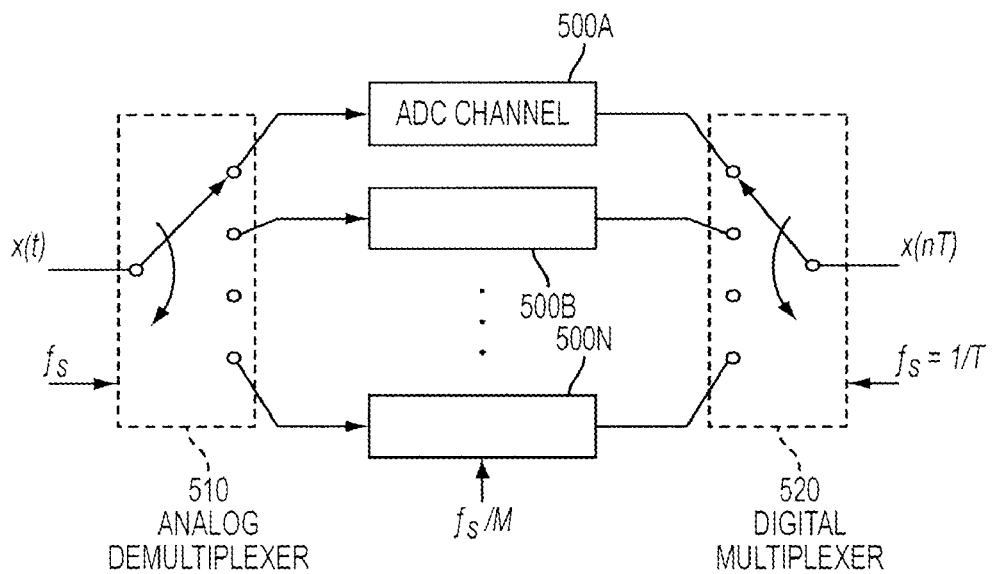
FIG. 5 is a block diagram of an interleaved ADC using parallel ADC channels.

FIG. 5 is a block diagram of an interleaved ADC designed for this application. In this design, the ADC includes eight parallel time-interleaved ADC channels 500A-H. The eight channels 500A-H are time interleaved by analog demultiplexer 510 and digital multiplexer 520. Each ADC channel 500 operates at a nominal conversion rate of 1.25 GS/s (actual conversion rate 1.29 GS/s). Each ADC channel 500 includes two ADC lookahead pipelines of 11 stages each, with one pipeline in service at any one time and the other available for calibration. Each of the 16 lookahead pipelines uses open-loop interstage amplifiers and subranging lookahead pipeline architecture. Lookup table calibration compensates for non-linearities. There are 16 lookup tables for the non-linear calibration, one for each of the 16 pipelines. Each lookup table takes the 11-bit raw input from the lookahead pipeline as input and outputs the corrected 8-bit digital value.

Allowing for the expected worst case offset values and interstage gain tolerance (for the open-loop amplifiers), computing the required redundancy gives an ADC pipeline with 11 stages and an interstage nominal gain G of 1.75. The 3 sigma input referred offset including comparators and residue amplifiers is estimated at 26 mV. This results in an interstage gain G of less than 1.82. With gain G=1.75, 11 stages are required to achieve 8 bit performance with 10% tolerance on the gain G.

The use of parallel (interleaved) ADC channels 500 can cause problems due to different gain and offset characteristics of the converters. The calculated tolerances for 8-bit performance include an offset mismatch <0.62 LSB=0.73 mV and gain mismatch <0.34%. However, these mismatches are largely compensated for by the lookup table. Similarly, the parallel ADC channels may have sampling time mismatch. The calculated tolerance is timing mismatch <4 ps (static skew). Conventional techniques are used to address timing mismatch.

Figure 6:
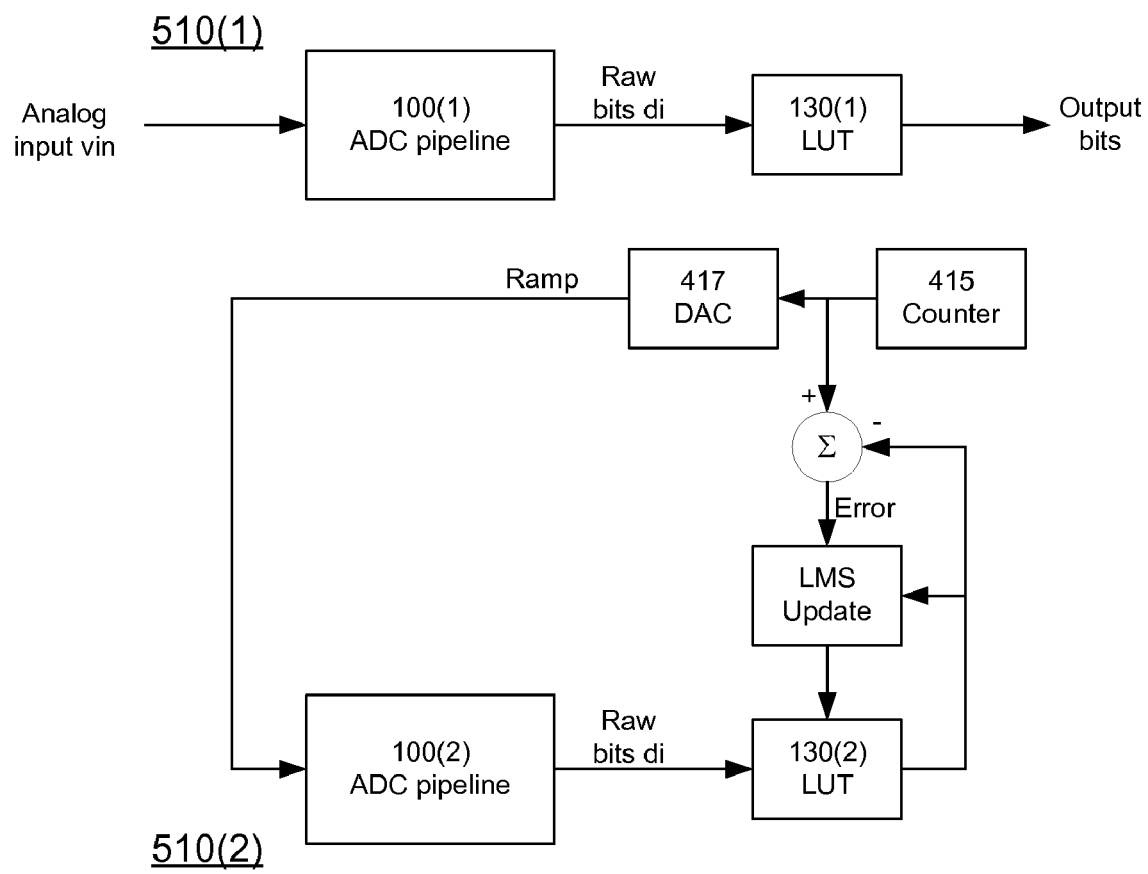
FIG. 6 is a block diagram illustrating calibration of an ADC channel.

FIG. 6 is a block diagram illustrating calibration of an ADC channel 500. Each interleaved ADC channel 500 include two pipeline units 510(1) and 510(2) which are constantly being swapped between normal operation and calibration modes, at a rate of about 1 MHz. At any given instant, one of the two pipelined units is in normal operation, while the other is in calibration. Approximately every microsecond, the units are automatically interchanged. Therefore, to an external observer, the pair of pipelined units 510(1) and 510(2) operates as a single high-precision ADC channel 500.

For the pipelined unit 510(1) that is in normal operation, the calibration portion of a pipelined unit 510(1) behaves as a simple lookup table 130(1) with 2048 8-bit entries. The raw 11-bit output from the ADC pipeline 100(1) is the memory address used to access the lookup table 130(1). The 8-bit content at the 11-bit memory address is the digital output of the ADC channel 500.

For the pipelined unit 510(2) that is in calibration, the lookup table 130(2) contents are updated. The update is based on a reference ramp generated by a digital counter 415 followed by a high precision DAC 417, which provides the input for the ADC pipeline 100(2) under calibration. The lookup table 130(2) is updated using an LMS algorithm, where the error is computed as the difference between the current content of the lookup table entry addressed by the pipeline output and the expected output, which is the output of the counter 415. If the two quantities are identical, the lookup table 130(2) entry is already correct and it does not need to be updated. Correspondingly, the error is zero, so that no update takes place. However, if the two quantities differ, there will be an update. The LMS algorithm effectively averages many updates, so that the entries in the lookup table 130(2) are not computed based on a single conversion, but on an average of many conversions.

Figure 7A:
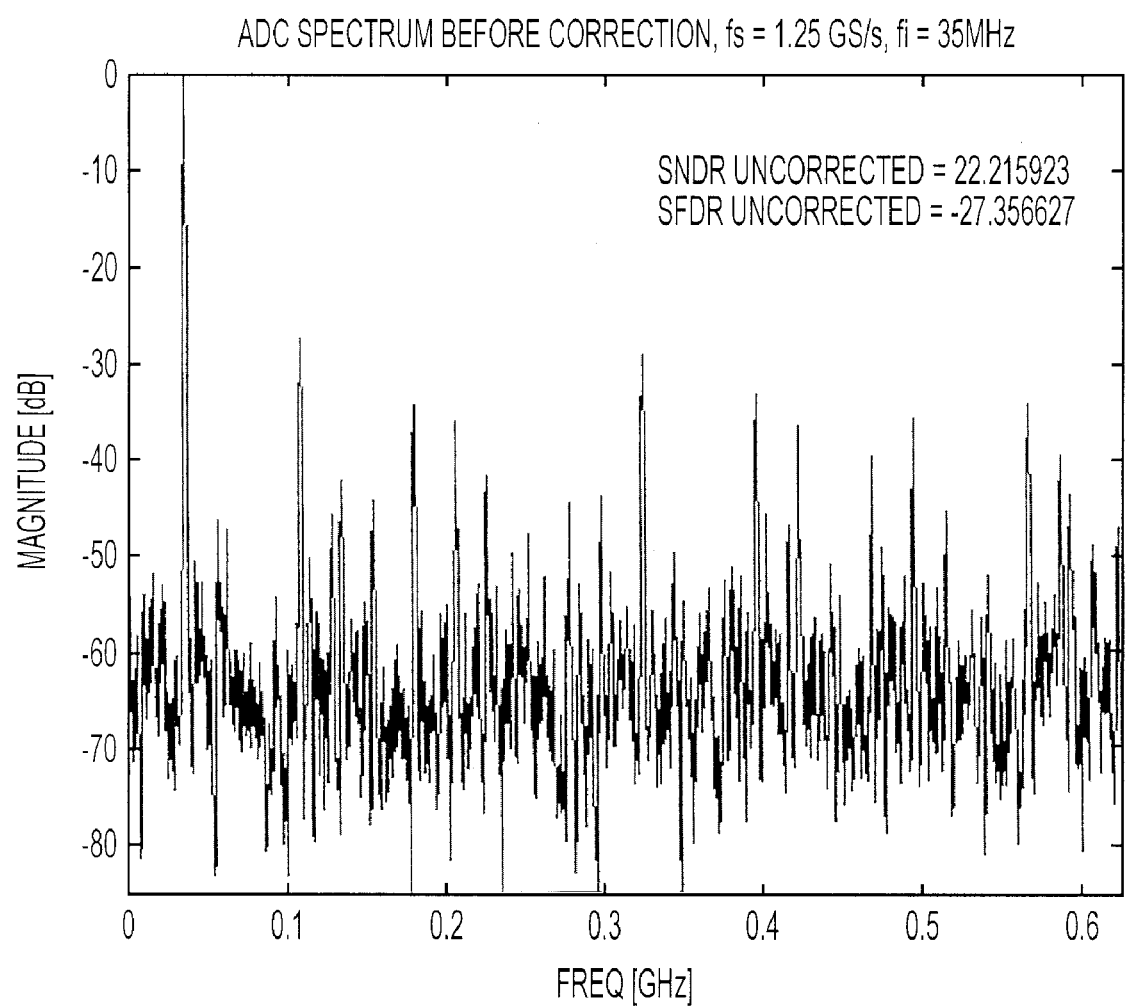
FIGS. 7A and 7B show simulation results for an example ADC with and without calibration, respectively.
Figure 7B:
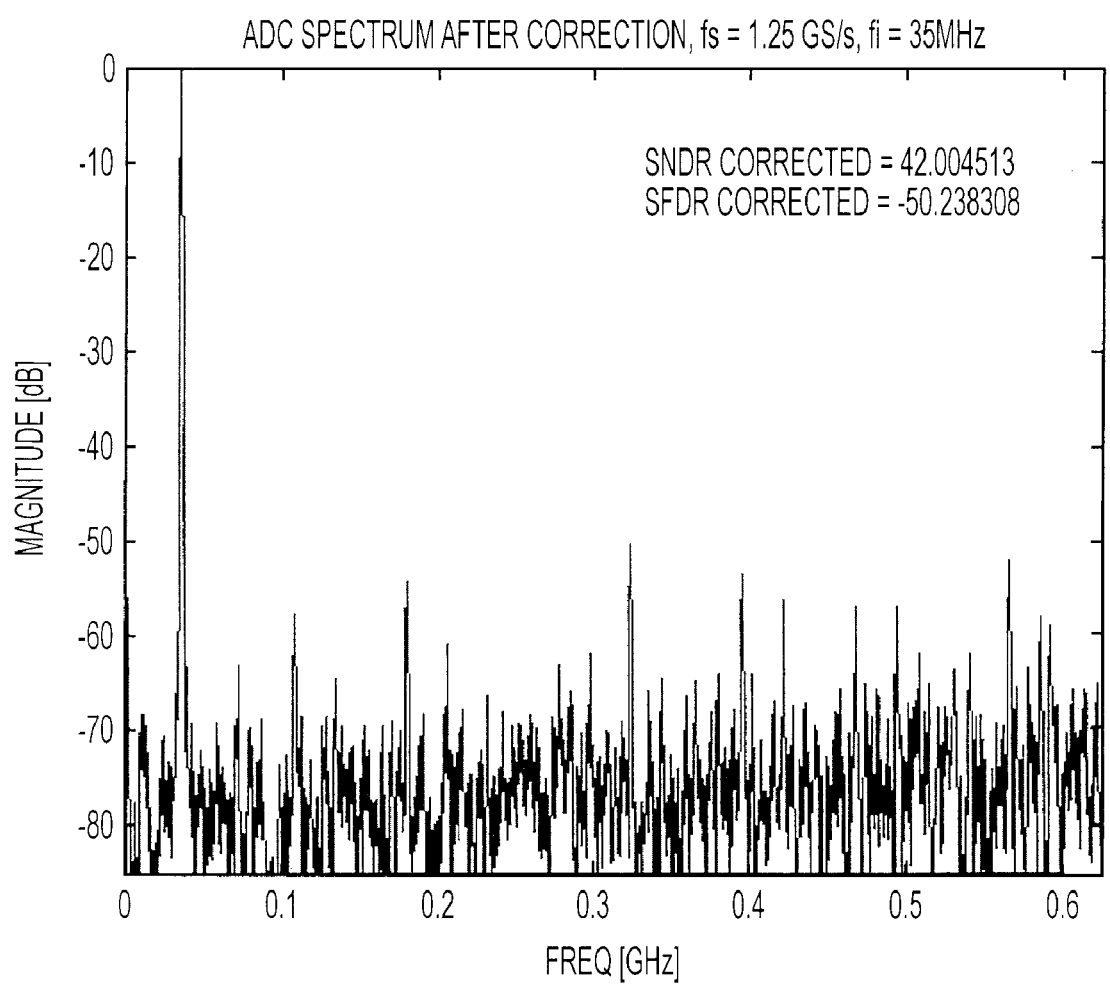

FIGS. 7A and 7B show simulation results for an ADC pipeline unit with and without calibration, respectively. The simulation is a transistor-level Cadence simulation for all circuits, except for a conservative Verilog-A comparator model. The pipeline unit uses an 11-bit ADC lookahead pipeline. The number of pipeline stages is 11, which results in a raw output of 11 bits. The calibration unit maps the 11 raw bits into 8 calibrated output bits. The pipeline unit achieves the following performance:

Full scale (peak-to-peak differential) of 250 mV

Channel conversion rate of 1.29 GS/s minimum

Output SNDR (calibrated) of 44 dB

BER of 1e-15

Note the 44 dB SNDR after calibration. FIG. 7A shows the power spectral density of the output without calibration, when the input is a pure sinusoid. FIG. 7B shows the power spectral density with calibration. The observed increase in signal to distortion ratio is the result of the calibration. The SNDR without calibration is 22.2+2 dB=24.2 dB, which yields 3.7 ENOB. The SNDR with calibration is 42.0+2 dB=44.0 dB, which yields 7.0 ENOB.

Although the detailed description contains many specifics, these should not be construed as limiting the scope of the invention but merely as illustrating different examples and aspects of the invention. It should be appreciated that the scope of the invention includes other embodiments not discussed in detail above. Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents. Furthermore, no element, component or method step is intended to be dedicated to the public regardless of whether the element, component or method step is explicitly recited in the claims.

In the claims, reference to an element in the singular is not intended to mean "one and only one" unless explicitly stated, but rather is meant to mean "one or more." In addition, it is not necessary for a device or method to address every problem that is solvable by different embodiments of the invention in order to be encompassed by the claims.

What is claimed is:

1. An ADC pipeline unit for converting input analog values to N-bit digital representations, the ADC pipeline unit comprising:
    a plurality of lookahead pipeline stages that generate a total of M raw bits, with M>N, the stages including open-loop residue amplifiers; and
    a calibration unit coupled to the lookahead pipeline stages to compensate for non-linearity in the open-loop residue amplifiers.

2. The ADC pipeline unit of claim 1 comprising M lookahead pipeline stages, wherein each lookahead pipeline stage generates 1 raw bit.

3. The ADC pipeline unit of claim 1 wherein the calibration unit comprises a lookup table.

4. The ADC pipeline unit of claim 3 wherein the lookup table uses the M raw bits as an address to the lookup table and the lookup table contains a corresponding N-bit digital representation at each M-bit address.

5. The ADC pipeline unit of claim 3 wherein the calibration unit updates the lookup table.

6. The ADC pipeline unit of claim 3 wherein the calibration unit updates the lookup table using an LMS algorithm.

7. The ADC pipeline unit of claim 1 wherein, for each stage other than the first stage, the stage includes a sub-ADC that determines possible raw bits for the stage without knowledge of the raw bits determined by a previous stage and then selects from among the possible raw bits based on the raw bits determined by the previous stage.

8. The ADC pipeline unit of claim 1 wherein the plurality of lookahead pipeline stages comprise:
    an input sample-and-hold stage for receiving the input analog value;
    a first lookahead pipeline half-stage coupled to the input sample-and-hold, for producing a first raw bit; and
    M-1 lookahead pipeline stages coupled in series to the first lookahead pipeline half-stage, each lookahead pipeline stage producing an additional raw bit;
    wherein each of the half-stage and the first M-2 stages includes an open-loop residue amplifier.

9. The ADC pipeline unit of claim 8 wherein:
    the first lookahead pipeline half stage includes a single comparator for determining the first raw bit; and
    each of the M-1 lookahead pipeline stages includes two comparators, one comparator for determining the raw bit for the stage assuming that the raw bit from a previous stage was 0 and another comparator for determining the raw bit for the stage assuming that the raw bit from the previous stage was 1.

10. The ADC pipeline unit of claim 9 wherein each of the M-1 lookahead pipeline stages further includes:
a switch for selecting an output from one of the two comparators based on the raw bit from the previous stage.

11. The ADC pipeline unit of claim 1 wherein each stage other than the beginning stages and end stages includes:
a sub-ADC for determining the raw bits for that stage; and
a sub-DAC coupled to a subtractor for determining a residue for that stage, wherein the open-loop residue amplifier applies a gain to the determined residue.

12. The ADC pipeline unit of claim 1 wherein the lookahead pipeline stages can operate at a conversion rate of 1.25 GS/s or higher at an effective resolution of at least 5 bits per sample.

13. The ADC pipeline unit of claim 1 wherein the lookahead pipeline stages can operate at a quantization energy of 0.3 pJ/conv-step or less.

14. The ADC pipeline unit of claim 1 wherein $N \geq 8$.

15. The ADC pipeline unit of claim 1 wherein $N \geq 5$.

16. The ADC pipeline unit of claim 1 wherein the lookahead pipeline stages can operate at a conversion rate of 1.25 GS/s or higher at an effective resolution of at least 5 bits per sample, the lookahead pipeline stages can operate at a quantization energy of 0.3 pJ/conv-step or less, and $N \geq 5$.

17. An analog-to-digital converter (ADC) channel for converting an input stream of analog values to an output stream of N-bit digital representations, the ADC channel comprising:
at least two ADC pipeline units, each ADC pipeline unit comprising:
a plurality of lookahead pipeline stages that generate a total of M raw bits, with M>N, the stages including open-loop residue amplifiers; and
a calibration unit coupled to the lookahead pipeline stages to compensate for non-linearity in the open-loop residue amplifiers;
wherein one ADC pipeline unit is in operation when the other ADC pipeline unit is in calibration.

18. The ADC channel of claim 17 wherein the ADC pipeline units automatically interchange operation and calibration.

19. An interleaved analog-to-digital converter (ADC) for converting an input stream of analog values to an output stream of N-bit digital representations, the ADC comprising:
an analog demultiplexer for receiving an input stream of analog values and demultiplexing the input stream into K analog channels; and
K ADC channels coupled to the analog demultiplexer, each ADC channel for converting one of the analog channels to a digital channel of corresponding N-bit digital representations, wherein each ADC channel includes an ADC pipeline unit comprising:
a plurality of lookahead pipeline stages that generate a total of M raw bits, with M>N, the stages including open-loop residue amplifiers; and
a calibration unit coupled to the lookahead pipeline stages to compensate for non-linearity in the open-loop residue amplifiers.

20. The interleaved ADC of claim 19 wherein each ADC channels includes at least two ADC pipeline units.

21. The interleaved ADC of claim 20 wherein, for each ADC channel, one ADC pipeline unit is in operation when the other ADC pipeline unit is in calibration.

22. The interleaved ADC of claim 20 wherein, for each ADC channel, one ADC pipeline unit is in operation when the other ADC pipeline unit is in calibration and the ADC pipeline units automatically interchange operation and calibration.

23. The interleaved ADC of claim 19 wherein each ADC pipeline unit has a sub-radix architecture.

24. The interleaved ADC of claim 19 wherein the calibration unit comprises a lookup table.

25. The interleaved ADC of claim 24 wherein the lookup table uses the M raw bits as an address to the lookup table and the lookup table contains a corresponding N-bit digital representation at each M-bit address.

26. The interleaved ADC of claim 19 wherein the plurality of lookahead pipeline stages comprise:
an input sample-and-hold stage for receiving the input analog value;
a first lookahead pipeline half-stage coupled to the input sample-and-hold, for producing a first raw bit; and
M-1 lookahead pipeline stages coupled in series to the first lookahead pipeline half-stage, each lookahead pipeline stage producing an additional raw bit;
wherein each of the half-stage and the first M-2 stages includes an open-loop residue amplifier.

27. The interleaved ADC of claim 26 wherein:
the first lookahead pipeline half-stage includes a single comparator for determining the first raw bit; and
each of the M-1 lookahead pipeline stages includes two comparators, one comparator for determining the raw bit for the stage assuming that the raw bit from a previous stage was 0 and another comparator for determining the raw bit for the stage assuming that the raw bit from the previous stage was 1.

28. The interleaved ADC of claim 27 wherein each of the M-1 lookahead pipeline stages further includes:
a switch for selecting an output from one of the two comparators based on the raw bit from the previous stage.

29. The interleaved ADC of claim 19 wherein each stage other than the beginning stages and end stages includes:
a sub-ADC for determining the raw bits for that stage; and
a sub-DAC coupled to a subtractor for determining a residue for that stage, wherein the open-loop residue amplifier applies a gain to the determined residue.

30. The interleaved ADC of claim 19 wherein the interleaved ADC can operate at a conversion rate of 10 GS/s or higher at an effective resolution of at least 5 bits per sample.

31. The interleaved ADC of claim 19 wherein the lookahead pipeline stages can operate at a conversion rate of 1.25 GS/s or higher.

32. The interleaved ADC of claim 19 wherein the lookahead pipeline stages can operate at a quantization energy of 0.3 pJ/conv-step or less.

33. The interleaved ADC of claim 19 wherein $N \geq 5$.

34. The interleaved ADC of claim 19 further comprising:
a digital multiplexer coupled to the K ADC channels for multiplexing the digital channels into the output stream of N-bit digital representations.

35. The interleaved ADC of claim 19 wherein the interleaved ADC can operate at a conversion rate of 10 GS/s or higher at an effective resolution of at least 5 bits per sample.

* * * * *

UNITED STATES PATENT AND TRADEMARK OFFICE
CERTIFICATE OF CORRECTION

PATENT NO.       : 7,576,676 B2                                             Page 1 of 1
APPLICATION NO.  : 11/551701
DATED            : August 18, 2009
INVENTOR(S)      : Carl Grace It is certified that error appears in the above-identified patent and that said Letters Patent is hereby corrected as shown below:

Column 9, Claim 14, after "N," delete "≧" and insert --≥--.

Column 9, Claim 15, after "N," delete "≧" and insert --≥--.

Column 9, Claim 16, after "N," delete "≧" and insert --≥--.

Column 10, Claim 33, after "N," delete "≧" and insert --≥--.

Signed and Sealed this

Twenty-fourth Day of November, 2009

David J. Kappos
*Director of the United States Patent and Trademark Office*